(12) United States Patent
Currie et al.

(10) Patent No.: US 6,592,020 B1
(45) Date of Patent: Jul. 15, 2003

(54) LEAD-FREE SOLDER PASTE

(75) Inventors: Mark Currie, Bedfordshire (GB); Angelo Elyassi, Bedfordshire (GB); Grahame Freeman, Hertfordshire (GB); Malcolm Warwick, Buckinghamshire (GB); Ian Wilding, Bedfordshire (GB)

(73) Assignee: Henkel Loctite Adhesives Limited, Hertfordshire (GB)

( * ) Notice: Subject to any disclaimer, the term of this patent is extended or adjusted under 35 U.S.C. 154(b) by 0 days.

(21) Appl. No.: 09/981,102

(22) Filed: Oct. 17, 2001

(51) Int. Cl.7 .................. B23K 31/02; B23K 1/20; B23K 35/24; B23K 35/34
(52) U.S. Cl. .................. 228/224; 228/223; 228/214; 228/248.1; 148/23; 148/24; 148/25; 148/26
(58) Field of Search .................. 228/224, 214, 228/223, 298.1; 148/22–26

(56) References Cited

U.S. PATENT DOCUMENTS

| 1,437,641 | A |   | 12/1922 | Ferriere et al. |
|---|---|---|---|---|
| 3,607,253 | A |   | 9/1971 | Cain et al. ............... 75/175 A |
| 4,042,725 | A |   | 8/1977 | Nomaki et al. ............. 427/57 |
| 4,170,472 | A |   | 10/1979 | Olsen et al. ............. 75/175 A |
| 4,218,248 | A | * | 8/1980 | Snyder et al. ............ 106/1.12 |
| 4,342,606 | A | * | 8/1982 | Notton ..................... 148/23 |
| 4,419,146 | A |   | 12/1983 | Roberts .................... 148/25 |
| 4,493,738 | A | * | 1/1985 | Collier et al. .............. 148/24 |
| 4,667,871 | A |   | 5/1987 | Mizuhara .................. 228/122 |
| 4,670,217 | A |   | 6/1987 | Henson et al. ............. 420/562 |
| 4,695,428 | A |   | 9/1987 | Ballentine et al. ......... 420/561 |
| 4,778,733 | A |   | 10/1988 | Lubrano et al. ........... 428/560 |
| 4,806,309 | A |   | 2/1989 | Tulman .................... 520/562 |
| 4,879,096 | A |   | 11/1989 | Naton ...................... 420/561 |
| 4,929,423 | A |   | 5/1990 | Tucker et al. ............. 420/561 |
| 5,102,748 | A |   | 4/1992 | Wylam et al. ............. 428/647 |
| 5,147,471 | A |   | 9/1992 | Kronberg .................. 420/556 |
| 5,158,657 | A | * | 10/1992 | Kadokura .................. 428/324 |
| 5,171,377 | A | * | 12/1992 | Shimizu et al. ............. 148/23 |
| 5,178,868 | A |   | 1/1993 | Malmqvist-Granlund et al. ...................... 424/490 |
| 5,196,070 | A | * | 3/1993 | Ables et al. ................ 148/23 |
| 5,242,658 | A |   | 9/1993 | Stevens et al. ............ 420/557 |
| 5,256,370 | A |   | 10/1993 | Slattery et al. ............ 420/557 |
| 5,316,205 | A |   | 5/1994 | Melton .................. 228/108.21 |
| 5,320,272 | A |   | 6/1994 | Melton et al. ......... 228/180.21 |

(List continued on next page.)

FOREIGN PATENT DOCUMENTS

| EP | 0 251 611 A2 | 1/1988 | .......... B23K/35/26 |
|---|---|---|---|
| EP | 0 336 575 A1 | 10/1989 | .......... B23K/35/26 |
| EP | 0 629 463 A1 | 12/1994 | .......... B23K/35/26 |
| EP | 0 629 464 A1 | 12/1994 | .......... B23K/35/26 |
| EP | 0 629 465 A1 | 12/1994 | .......... B23K/35/26 |
| EP | 0 629 466 A1 | 12/1994 | .......... B23K/35/26 |
| EP | 0 629 467 A1 | 12/1994 | .......... B23K/35/26 |
| GB | 2 158 459 A | 11/1985 | .......... C22C/13/00 |
| JP | 82030598 | 6/1982 | .......... B23K/35/26 |
| JP | 60-203386 A | * 10/1985 | |
| JP | 3027441 | 8/1991 | .......... B23K/35/26 |
| JP | A-5050286 | 3/1993 | |
| JP | 2001-347395 A | * 12/2001 | |
| WO | WO-A-94/2563 | 2/1994 | .......... C09K/5/04 |

*Primary Examiner*—Tom Dunn
*Assistant Examiner*—L. Edmondson
(74) *Attorney, Agent, or Firm*—Steven C. Bauman

(57) ABSTRACT

The invention relates to a lead-free solder paste comprising a solder paste flux and solder alloy particles that are substantially lead-free wherein the solder paste flux comprises resin dissolved in a solvent and also includes undissolved resin particles less than 25 μm in size homogenously dispersed therein to provide improved solder alloy powder coalescence and substrate surface wetting while maintaining appropriate solder paste rheology for use in printed circuit board assembly processes.

20 Claims, 2 Drawing Sheets

U.S. PATENT DOCUMENTS

| | | | | |
|---|---|---|---|---|
| 5,328,660 A | | 7/1994 | Gonya et al. | 420/562 |
| 5,344,592 A | * | 9/1994 | Wilczek et al. | 252/512 |
| 5,344,607 A | | 9/1994 | Gonya et al. | 420/562 |
| 5,352,407 A | | 10/1994 | Seelig et al. | 420/561 |
| 5,390,080 A | | 2/1995 | Melton et al. | 361/765 |
| 5,393,489 A | | 2/1995 | Gonya et al. | 420/561 |
| 5,405,577 A | | 4/1995 | Seelig et al. | 420/561 |
| 5,411,703 A | | 5/1995 | Gonya et al. | 420/561 |
| 5,414,303 A | | 5/1995 | Gonya et al. | 257/772 |
| 5,429,689 A | | 7/1995 | Shangguan et al. | 148/400 |
| 5,435,968 A | | 7/1995 | Panthofer | 420/561 |
| 5,439,639 A | | 8/1995 | Vianco et al. | 420/562 |
| 5,445,004 A | | 8/1995 | Nannini et al. | 72/272 |
| 5,452,842 A | | 9/1995 | Melton et al. | 228/180.22 |
| 5,527,628 A | | 6/1996 | Anderson et al. | 428/647 |
| 5,538,686 A | | 7/1996 | Chen et al. | 420/557 |
| 5,549,761 A | * | 8/1996 | Winston et al. | 134/2 |
| 5,569,433 A | | 10/1996 | Chen et al. | 420/557 |
| 5,580,520 A | | 12/1996 | Slattery et al. | 420/557 |
| 5,658,528 A | | 8/1997 | Ninomiya et al. | 420/562 |
| 5,698,160 A | | 12/1997 | Chen et al. | 420/557 |
| 5,730,932 A | | 3/1998 | Sarkhel et al. | 420/562 |
| 5,733,501 A | | 3/1998 | Takao et al. | 420/562 |
| 5,755,896 A | | 5/1998 | Paruchuri et al. | 148/400 |
| 5,762,866 A | | 6/1998 | Jin et al. | 420/557 |
| 5,817,194 A | | 10/1998 | Nagai et al. | 148/400 |
| 5,837,191 A | | 11/1998 | Gickler | 420/560 |
| 5,843,371 A | | 12/1998 | Yoo et al. | 420/562 |
| 5,851,482 A | | 12/1998 | Kim | 420/557 |
| 5,863,493 A | | 1/1999 | Achari et al. | 420/557 |
| 5,874,043 A | | 2/1999 | Sarkhel et al. | 420/557 |
| 5,918,795 A | | 7/1999 | Yamaguchi et al. | 228/200 |
| 5,928,440 A | * | 7/1999 | Kuramoto et al. | 148/22 |
| 6,077,725 A | * | 6/2000 | Degani et al. | 438/107 |
| 6,140,402 A | * | 10/2000 | Dietz et al. | 428/457 |
| 6,231,691 B1 | | 5/2001 | Anderson et al. | 148/400 |
| 6,340,113 B1 | * | 1/2002 | Avery et al. | 228/233.2 |
| 2002/0033204 A1 | * | 3/2002 | Saita et al. | 134/2 |
| 2002/0190441 A1 | * | 12/2002 | Billiet et al. | 264/669 |

* cited by examiner

LEAD-FREE SOLDER PASTE

BACKGROUND OF THE INVENTION

1. Field of the Invention

This invention relates to lead-free solder paste for use in lead-free soldering of components in the electronics industry.

2. Brief Description of Related Technology

Solder paste is a homogenous, stable suspension of solder particles in a solder paste flux and has many applications in the electronics industry, particularly in the manufacture of printed circuit boards (PCB).

Reflow soldering is used in the automated manufacture of PCB, wherein electronic components are surface mounted on PCB to which a solder paste has previously been applied by a method such as screen printing, stencilling or dispensing. The PCB is then subjected to a sufficiently high temperature, to cause the solder paste flux and the solder particles to liquefy and to join the components in place on the PCB. The heat can be supplied by, for example, infrared, heated conveyor belt or convective means.

Soldering will not take place without solder paste flux, which is required to improve the coalescence of the molten solder particles and the wetting of metallic substrates. In particular, solder paste flux removes oxide layers from the solder and joint surfaces, transports reaction products away from the soldering zone, and protects the clean joint surfaces from oxidation until soldering has taken place. Solder paste flux also acts as a heat transfer medium which ensures that all parts of the joint reach a temperature above the melting point of the solder particles.

Many solder paste fluxes are based on rosin, which is a natural material obtained from the sap of pine trees and contains isomers of abietic acid. Synthetic resins may also be used. These materials may be referred to generically as resins and as used herein the term "resin" includes natural resins such as rosin, chemically modified rosin, and synthetic resins. To form solder paste fluxes the resins are dispersed in solvents, together with additional activators and gelling agents.

Activators are added to decompose and remove any oxide film existing in the portion where soldering is going to be carried out, and are usually organic compounds containing halides, typically amine hydrohalogenides, such as diethylamine hydrochloride or weak halide-free organic acids. The resin may be a weak acidic activator but it is also added to protect the metals from oxidation during solder paste reflow. The organic solvent dissolves and supplies the resin and activators to the portion to be soldered and is typically an alcohol, glycol, glycol ether, or ester. Most of the organic solvent is evaporated during the preheating step of soldering. A gelling agent such as ethyl cellulose or modified castor oil is used to maintain the necessary viscosity of the solder paste flux. This provides the correct physical characteristics to maintain a homogenous dispersion of solder powder particles, to provide a material that can be screen printed and to hold electronic components in place before the soldering process is carried out. It has hitherto been regarded as essential in the formulation of resin based solder paste fluxes that the resin is completely dissolved in the solvent.

Use of high boiling range solvents is desirable in the formulation of solder paste fluxes because it provides for a more robust solder paste printing process and shows improved ability to hold electronic components in place before the reflow assembly process. However, it has now been found by thermogravimetric analysis of solder paste through a typical PCB reflow process that solvent loss continues throughout reflow and that a significant amount of solvent is present in the molten resin before and even during the melting of solder alloy particles. It has been postulated that these solvents plasticise the resins so that they are more fluid during the reflow process and this has the disadvantage that it allows the flux to move away from the region where the cleaning behaviour is necessary and reduces the ability of the solder paste flux to prevent re-oxidation of the metal surfaces. As the reflow process becomes more aggressive, i.e., longer duration and/or higher temperatures, the effects of re-oxidation become more apparent.

Adding extra activators to the solder paste flux can improve the ability of the flux to withstand aggressive reflow processes such as in lead-free soldering, but significant additional amounts of metal salts will be produced and left in flux residues after reflow. If the same flux is used under less aggressive conditions there will be significant additional quantities of unused activator in the residues. Both the metal salts and the unused activator reduce the electrical integrity of the flux residues. Using additional activators and/or developing improved halide-containing activators is thus not very effective in improving the resistance of solder pastes in aggressive reflow processes. Additional activators also adversely affect the shelf life of solder pastes and reduce the resistance of the solder paste to drying during the printing process.

U.S. Pat. No. 4,419,146 is directed to the manufacture of useable fluxes from solvent/activator combinations that are not soluble in one another. Specifically, solder flux compositions are disclosed which are prepared by forming a dispersion of a flux material in a liquid in which the flux is substantially insoluble, wherein the flux material is a mixture of tartaric acid and sarcosine and the liquid is isopropyl alcohol with or without water. JP 63-123,592 is directed to a cream solder comprising a tin or lead solder alloy with a flux with a first gel flux comprising a rosin hardly soluble in organic solvent and an activator and a second gel flux comprising a rosin easily soluble in the organic solvent.

In the past most solder compositions used were of the tin-lead type which proved useful in most common applications. However, the use of lead in solder composition has come under scrutiny from environmental factions and has become undesirable in future design applications. As a result, attempts have been made to overcome the use of lead from solder compositions. Such lead-free solder compositions include tin (95% by weight) and antimony (5% by weight) solder compositions. Others include tin, copper and silver (typically 95.5% by weight tin, 4% by weight copper and 0.5% by weight silver) or tin, antimony, zinc and silver (typically 95% by weight tin, 3% by weight antimony, 1.5% by weight zinc and 0.5% by weight silver). Bismuth may also be used together with tin, antimony and silver in a range of approximately 1.0% to 4.5% by weight. Patents directed to lead-free alloys include U.S. Pat. Nos. 1,437,641, 3,607,253, 4,042,725, 4,170,472, 4,667,871, 4,670,217, 4,695,428, 4,758,407, 4,778,733, 4,806,309, 4,879,096, 4,929,423, 5,094,813, 5,102,748, 5,147,471, 5,242,658, 5,256,370, 5,316,205, 5,320,272, 5,328,660, 5,344,607, 5,352,407, 5,390,080, 5,393,489, 5,405,577, 5,411,703, 5,414,303, 5,429,689, 5,435,968, 5,439,639, 5,452,842, 5,455,004, 5,527,628, 5,538,686, 5,569,433, 5,580,520, 5,658,528, 5,698,160, 5,718,868, 5,730,932, 5,733,501, 5,755,896, 5,762,866, 5,817,194, 5,837,191, 5,843,371, 5,851,482, 5,863,493, 5,874,043, 5,918,795, and 6,231,691; European Patent Documents EP-A-0 251 611, EP-A-0 336 575, EP-A-0 629 463, EP-A-0 629 464, EP-A-629 465, EP-A-629 466, and EP-A-629 467; Great Britain Patent Document GB-A-2,158,459; Japanese Patent Documents JP-A-5050286, and JP-A-8230598; and International Patent Publication WO-A-94/2563 the disclosures of each of which are hereby expressly incorporated herein by reference.

The invention provides a lead-free solder paste which does not have the disadvantages noted above and is more suitable for use under aggressive conditions as required when using lead-free solders.

SUMMARY OF THE INVENTION

According to one aspect, the present invention provides a lead-free solder paste comprising a solder paste flux and solder alloy particles that are substantially lead-free wherein the solder paste flux comprises resin dissolved in a solvent and also includes undissolved resin particles less than 25 $\mu$m in size homogenously dispersed therein to provide improved solder alloy powder coalescence and substrate surface wetting while maintaining appropriate solder paste rheology for use in printed circuit board assembly processes.

According to a further aspect the present invention provides a method for the manufacture of a lead-free solder paste wherein the solder paste flux has two or more resins comprising the steps of dissolving the more soluble resin in part of the solvent and cooling the resultant solution to about 40° C. to 70° C., adding a dispersion of the less soluble resin made in the remainder of the solvent to the cooled solution and adding a gelling agent and allowing the mixture to cool and mixing with lead-free solder alloy particles.

The gelling agent is added under controlled temperature and shear conditions and the mixture is then allowed to cool. Mixing is achieved with a high-speed emulsifier that provides the necessary shear and the final temperature during mixing is dependent on the solvent and gelling agent combination but is typically in the range 50° C. to 70° C.

Some of the resin initially dissolved also crystallises out of solution on cooling. The finished flux therefore contains (a) resin dissolved (b) resin originally dissolved but now dispersed as solid (c) resin added as a dispersion.

According to a still further aspect, the present invention provides a method for reducing the plasticisation of resin by solvents during reflow in a lead-free solder paste wherein the solder paste flux comprises resin and solvent which in addition to resin dissolved in the solvent also includes undissolved resin homogenously dispersed in the solvent.

It has been found according to the present invention that if the solder paste flux resin is chosen so that some of the resin is undissolved in the solvent system there is a significant improvement in the wetting and surface appearance of the solder joint in an aggressive reflow process. This results in the solder paste flux solvent being substantially insoluble in the resin melt during the reflow process so that the plasticising effect is significantly reduced. The lead-free solder paste according to the invention shows resistance to aggressive reflow processes without the need for high levels of activators that may compromise the electrical reliability of the residues and without compromising printing performance and storage stability.

DETAILED DESCRIPTION OF THE INVENTION

Figure 1:
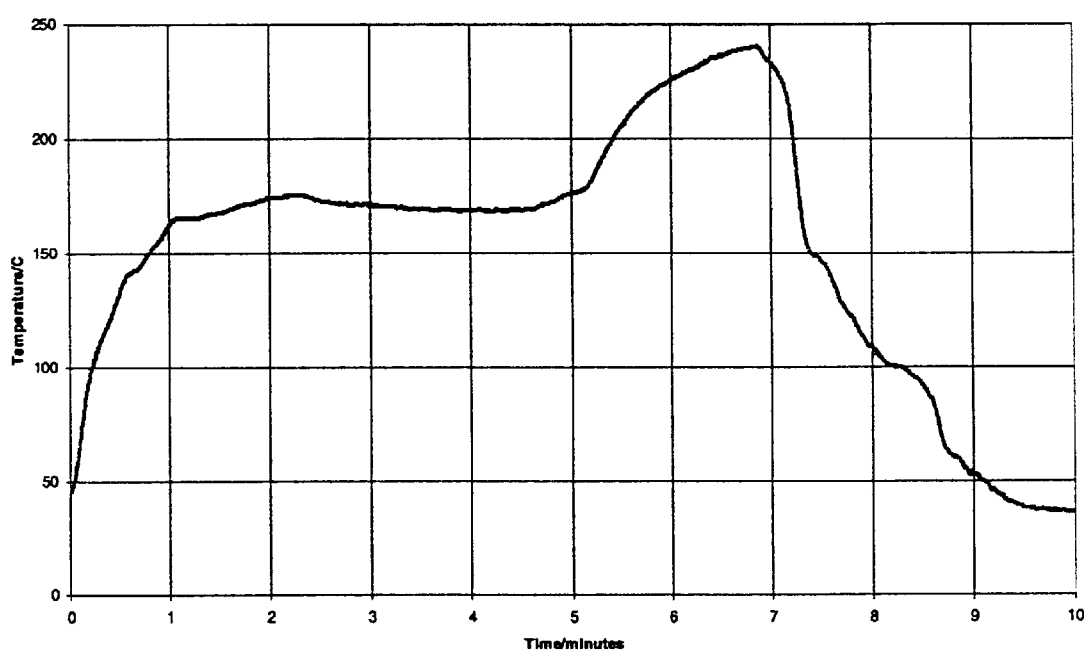
FIG. 1 depicts a temperature-time profile for solder reflow of a lead free solder paste.

The lead-free solder paste flux used in the solder paste according to the invention must include a proportion of the resin which is undissolved in the solvent. This may be achieved by using a solder paste flux resin which is sparingly soluble in the solvent so that some of the resin is in solution and some is not. Alternatively a blend of two or more resins can be used one of which is more soluble in the solvent than the other. In order that the solder paste produced using the flux of this invention can be used in practical application processes, it is necessary to ensure that it has a suitable rheology. Dispersing particles of undissolved resin in the solder paste flux usually has the effect of increasing the viscosity of the flux and the resulting solder paste so that it is unsuitable for application to a printed circuit board by conventional printing or dispensing processes. To overcome this problem, the particle size of the dispersed resin in the solder paste flux of this invention must be less than 25 $\mu$m and preferably in the range 5 $\mu$m to 15 $\mu$m.

The solder paste flux according to the invention may be made by initial dissolution of all the resin components in the solvent blend under conditions of vigorous mixing and at temperatures sufficiently high to dissolve the resin. Preferably the temperature is from about 70° C. to 120° C., most preferably about 95° C. A high shear dispersing mixer may be used. By controlling the cooling rate of the flux, it is possible to control the size of the crystals of the resin that are formed. This method is particularly suitable when a single sparingly soluble resin is used. An alternative method used involves the use of two or more resins and involves dissolving the more soluble resins and flux activator chemicals in part of the solvent blend, and allowing it to cool to about 40° C. to 70° C., preferably about 60° C. Preferably 80 to 90% of the solvent may be used if the more soluble resin is 80 to 90% of the total resin content of the final. At this stage, some of the more soluble resin may crystallise from solution. Further undissolved resin is then added as a dispersion of the less soluble resin in the remainder of the solvent. Gelling agents can then be added to the mixture of resin solution and dispersed solution, which is then heated and sheared and cooled to create a solder paste flux of the correct rheology. For example, a modified hydrogenated castor oil wax may be vigorously stirred into the mixture with an emulsifier up to a peak temperature of 70° C. Other gelling agents and solvent combinations require different peak temperatures in the range of about 20° C. to 80° C.

The resultant resin particles remain stable in the flux during the subsequent manufacturing steps and also remain stable when the completed solder paste is stored prior to use in the reflow process. Although the sparingly soluble resins do not dissolve in the solvent in the solder paste flux, they are mutually soluble in the other resins. Consequently after PCB reflow, the residues are homogenous and behave like resin in conventional solder paste formulations.

The resin used in the solder paste flux may be rosin based, neutral or weakly acidic, or may be a synthetic resin. Preferably, the resin particles are the same size or smaller than the solder particles (20 to 45 $\mu$m in common solder pastes).

Activators used in the solder paste fluxes include weak carboxylic acids, amines and amine hydrohalide salts which include alkyl and cycloalkyl amines and aromatic amines and the hydrohalide salts of such amines. For example acids such as malonic acid, salicylic acid, adipic acid, succinic acid; amines such as diethylamine, triethylamine, cyclohexylamine, N-methylaniline and their corresponding hydrohalides such as triethylamine hydrobromide.

Organic solvents used in the solder paste fluxes include monohydric alcohols, for example, terpineol, and esters, for example, 2-ethoxyethyl acetate. Such solvents have a relatively low melting point and a boiling point below the soldering temperature, and have low moisture absorption. These solvents may be blended with high molecular weight alcohols, polyhydric alcohols such as glycol, for example diethylene glycol, dipropylene glycol or hexylene glycol, or hydric esters, for example triethylene glycol monethyl ether or tetraethylene glycol dimethyl ether, provided that the blend has the aforementioned qualities.

Gelling or thickening agents used in the solder paste flux may be ones used in conventional solder paste fluxes such as, for example, ethylcellulose hydrogenated castor oil, fumed silica, or organoclays. Combinations of two or more gelling agents may also be present in the solder paste flux.

Preferably tin-rich compositions based on combinations of Sn(Ag)(Cu)(Bi)(Sb) are used. The preferred solder alloy consists of about 3–4% silver and about 0.5 to 1.0% copper, remainder tin, melting at 217° C. This alloy is the lead-free solder with the lowest melting point that has eutectic melting characteristics, i.e., melts at a single temperature with no pasty range. It has good soldering characteristics and is gaining world-wide acceptance as the first choice lead-free solder. Other alloys containing additions of bismuth, zinc, or indium have lower melting temperatures but also have significant pasty ranges, and have significant processing and reliability issues.

In a preferred embodiment according to the present invention there is provided a solder paste wherein the solder paste flux comprises from about 1 to about 60% soluble rosin, from about 1 to about 60% insoluble rosin, such that the total resin content of the flux is in the range of from about 40 to about 90% and preferably from about 50 to about 80%, from about 0.1 to about 35% activator, from about 10 to about 50% solvent and from about 0.1 to about 5% thickening agent.

Preferably, the solder paste comprises from about 70 to about 92% by weight of the lead-free solder alloy particles, from about 8 to about 30% by weight of the solder paste flux containing from about 50 to 80% resins, from about 20 to 50% solvents, from about 0.1 to 5% activators, and from about 0.1% to about 5% by weight of a gelling agent.

The invention is illustrated by the following examples. The following tests and protocols were used in the examples.

Acid Value Test

The industry-standard method of acid value determination described in IPC TM-650 Method 2.3.13 was used for all the raw materials and the results are expressed as mg KOH/g total flux based on the formulation.

Halide Value Test

The industry-standard method of acid value determination described in IPC TM-650 Method 2.3.33 was used for all the raw materials and the results are expressed as equivalent chloride concentration as % of total flux based on the formulation.

Solder Paste Formulations

The finished solder paste was manufactured in each example by mixing 88% by weight solder powder with 12% by weight solder paste flux. The solder powder was lead-free used was SnAg3.8Cu0.7 atomised to produce essentially spherical particles predominantly in the particle size range 20–45 μm. Other alloys, include SnAg3.6, SnCu0.7 and similar tin-rich compositions based on combinations of Sn(Ag)(Cu)(Bi)(Sb) also show improved reflow behaviour with the fluxes described in this invention. Other powder particle sizes and metal contents appropriate to the printed circuit board assembly process may also be formulated with the fluxes described in this invention.

Reflow Soldering

Solder paste was printed onto a conventional printed circuit board. The metallisation on the PCB was copper. Reflow was carried out in a Seho FDS 6440 3.6 oven using either air as the atmosphere or nitrogen to give a residual oxygen content of less than 150 ppm. The temperature/time profile used is shown in FIG. 1.

Table 1 shows the range of quality that can be obtained on reflow of a solder paste.

TABLE 1

| Rank | |
| --- | --- |
| | Solder Surface Description |
| Bad | Complete non-coalescence |
| | Fillet surface covered with non-coalesced solder |
| | Fillet surface partly covered with non-coalesced solder |
| | Non coalescence at fillet ends only |
| Good | Complete coalescence |
| | Solder Wetting Description |
| Bad | No wetting |
| | Poor wetting, extensive de-wetting or non-wetting |
| | Fair pad coverage. Some non-wetting or de-wetting, fillet edges may be uneven due to non-wetting of pad edges |
| | Good pad coverage, edges/ends of pads have some bare copper, fillet has good edge shape, no de-wetting or significant non-wetting. |
| Good | Almost complete pad coverage (all of pad except corners) |

COMPARATIVE EXAMPLE 1

Tin-Lead Alloy Reflow

Figure 2:
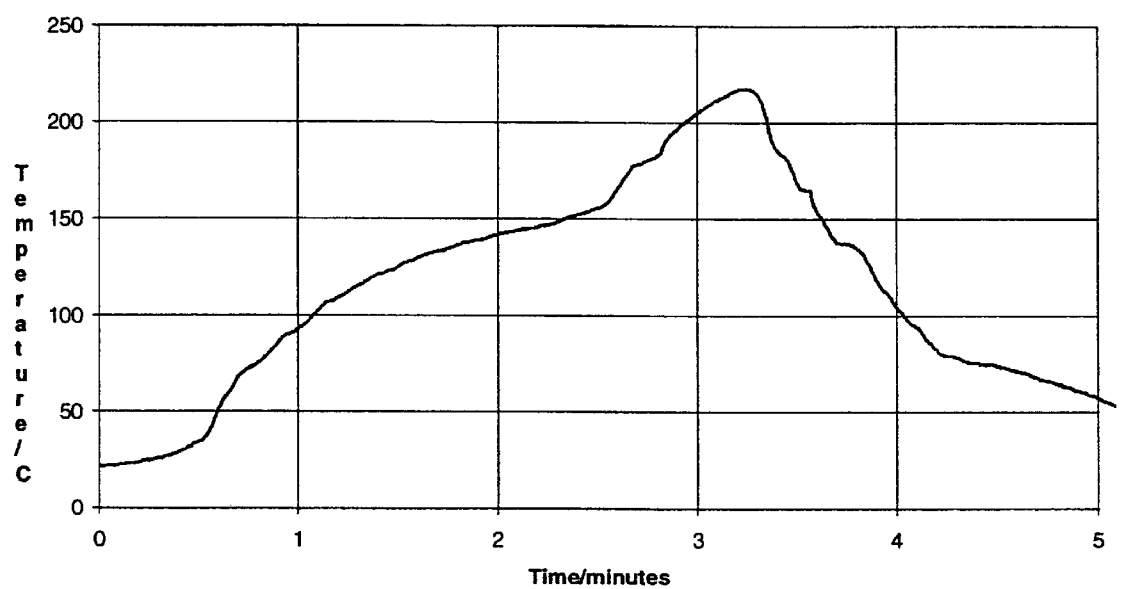
FIG. 2 depicts a conventional temperature-time profile for solder reflow of a tin-lead solder paste.

The solder particle used in conventional reflow conditions is a tin-lead alloy. FIG. 2 shows a conventional time/temperature reflow profile for a tin-lead solder (SN62 or SN63 solder paste). Starting from ambient, the paste is heated to 150° C. at about 60° C./min, and then from 150° C. to a peak reflow temperature of 217° C. at about 85° C./min. The solder is above its melting point for about 45 seconds. From the peak at 217° C. the solder is cooled at about 140° C./min to 80° C.

EXAMPLE 1

Solder paste flux formulations 1A, 1B and 1C were made in accordance with Table 2 and illustrate the effect of changing from a single resin that is all in solution (1A) to a single resin that is only partially in solution (1B and 1C). Factors contributing directly to flux activity are held constant in formulations 1A, 1B, and 1C. The results are shown in Table 3. The proportions of the resin in solution/out of solution were approximately 100/0 for 1A, 75/25 for 1B and 50/50 for 1C.

TABLE 2

| RAW MATERIAL | WT % |
|---|---|
| 1A: CONVENTIONAL FORMULATION | |
| Dimerised rosin (Resine K10, Granel S. A.) | 62.6 |
| Malonic acid | 0.53 |
| Salicylic acid | 1.0 |
| Trans-2,3-dibromo-2-butene-1,4-diol | 0.3 |
| 2-bromoethylamine hydrobromide | 0.58 |
| Di-ethylene glycol di-butyl ether (Grant Chemical) | 30 |
| Modified hydrogenated castor oil | 5 |
| 1B: EQUIVALENT FORMULATION BUT WITH RESINS NOT IN SOLUTION | |
| Partially hydrogenated rosin (Staybelite Resin-E, Hercules B. V.) | 62.6 |
| Malonic acid | 0.53 |
| Salicylic acid | 1.0 |
| Trans-2,3-dibromo-2-butene-1,4-diol | 0.3 |
| 2-bromoethylamine hydrobromide | 0.58 |
| Di-ethylene glycol di-butyl ether (Grant Chemical) | 30 |
| Modified hydrogenated castor oil (Univar plc) | 5 |
| 1C: EQUIVALENT FORMULATION BUT WITH RESINS NOT IN SOLUTION | |
| Disproportionated gum rosin (Resarim B300, Resitec) | 62.6 |
| Malonic acid | 0.53 |
| Salicylic acid | 1.0 |
| Trans-2,3-dibromo-2-butene-1,4-diol | 0.3 |
| 2-bromoethylamine hydrobromide | 0.58 |
| Di-ethylene glycol di-butyl ether (Grant Chemical) | 30 |
| Modified hydrogenated castor oil (Univar plc) | 5 |

TABLE 3

| | VALUE/COMMENTS | | |
|---|---|---|---|
| PROPERTY | EXAMPLE 1A | EXAMPLE 1B | EXAMPLE 1C |
| Flux Appearance | Viscous solution | Viscous solution with homogeneous distribution of resin particles | Viscous solution with homogeneous distribution of resin particles |
| *Flux Activity* | | | |
| Acid Value | 109.3 | 109.9 | 113.0 |
| Halide Value | 0.45 | 0.45 | 0.45 |
| *Solder Paste Reflow* | | | |
| Nitrogen Atmosphere | Bright shiny solder surface | Bright shiny solder surface | Bright shiny solder surface |
| Air Atmosphere | Complete non-coalescence Poor wetting extensive de-wetting or non-wetting | Non coalescence at fillet ends only. Good pad coverage, edges/ends of pads have some bare copper, fillet has good edge shape, no de-wetting or significant non-wetting | Fillet surface partly covered with non-coalesced solder. Fair pad coverage. Some non-wetting or de-wetting, fillet edges may be uneven due to non-wetting of pad edges |

EXAMPLE 2

Solder paste flux formulations 2A and 2B were made in accordance with Table 4 which illustrate the effect of partially substituting a resin that is completely in solution (2A) by one that is not completely in solution (2B). Factors contributing directly to flux activity are held constant in formulations 2A and 2B. The results are shown in Table 5. The proportions of the resin in solution/out of solution were approximately 100/0 for 2A, 75/25 for 2B.

TABLE 4

| RAW MATERIAL | WT % |
|---|---|
| A: CONVENTIONAL FORMULATION | |
| U.S. Gum rosin | 60 |
| Malonic acid | 0.53 |
| Salicylic acid | 1.0 |
| Trans-2,3-dibromo-2-butene-1,4-diol | 0.3 |
| 2-bromoethylamine hydrobromide | 0.58 |
| Di-ethylene glycol di-butyl ether (Grant Chemical) | 12.6 |
| Tri-propylene glycol n-butyl ether (Dow) | 20 |
| Modified hydrogenated castor oil | 5 |
| B: EQUIVALENT FORMULATION BUT WITH RESINS NOT IN SOLUTION | |
| U.S. Gum rosin | 30 |
| Partially hydrogenated rosin (Staybelite Resin-E, Hercules B. V.) | 30 |
| Malonic acid | 0.53 |
| Salicylic acid | 1.0 |
| Trans-2,3-dibromo-2-butene-1,4-diol | 0.3 |
| 2-bromoethylamine hydrobromide | 0.58 |
| Di-ethylene glycol di-butyl ether (Grant Chemical) | 12.6 |
| Tri-propylene glycol n-butyl ether (Dow) | 20 |
| Modified hydrogenated castor oil (Univar plc) | 5 |

TABLE 5

| PROPERTY | VALUE/COMMENTS | |
| --- | --- | --- |
| | EXAMPLE 2A | EXAMPLE 2B |
| Flux Appearance | Viscous solution | Viscous solution with homogeneous distribution of resin articles |
| Flux Activity | | |
| Acid Value | 106.9 | 106.3 |
| Halide Value | 0.45 | 0.45 |
| Solder Paste Reflow | | |
| Nitrogen Atmosphere | Bright shiny solder surface | Bright shiny solder surface |
| Air Atmosphere | Fillet surface covered with non-coalesced solder. Fair pad coverage. Some non-wetting or de-wetting, fillet edges may be uneven due to non-wetting of pad edges | Non coalescence at fillet ends only. Fair pad coverage. Some non-wetting or de-wetting, fillet edges may be uneven due to non-wetting of pad edges. |

EXAMPLE 3

Solder paste flux formulations 3A and 3B were made in accordance with Table 6 and also illustrate the effect of partially substituting a resin that is completely in solution by one that is not completely in solution. Factors contributing directly to flux activity are held constant in examples 3A and 3B. The results are shown in Table 7. The proportions of the resin in solution/out of solution were approximately 100/0 for 3A, 75/25 for 3B.

TABLE 6

| RAW MATERIAL | WT % |
| --- | --- |
| A: CONVENTIONAL FORMULATION (Same as 1A) | |
| Dimerised rosin (Resine K10, Granel S. A.) | 62.6 |
| Malonic acid | 0.53 |
| Salicylic acid | 1.0 |
| Trans-2,3-dibromo-2-butene-1,4-diol | 0.3 |
| 2-bromoethylamine hydrobromide | 0.58 |
| Di-ethylene glycol di-butyl ether (Grant Chemical) | 30 |
| Modified hydrogenated castor oil | 5 |
| B: EQUIVALENT FORMULATION BUT WITH RESINS NOT IN SOLUTION | |
| Partially hydrogenated rosin (Staybelite Resin-E, Hercules B. V.) | 50 |
| Fully hydrogenated rosin (Foral AX-E, Hercules) | 12.6 |
| Malonic acid | 0.53 |
| Salicylic acid | 1.0 |
| Trans-2,3-dibromo-2-butene-1,4-diol | 0.3 |
| 2-bromoethylamine hydrobromide | 0.58 |
| Di-ethylene glycol di-butyl ether (Grant Chemical) | 30 |
| Modified hydrogenated castor oil (Univar plc) | 5 |

TABLE 7

| PROPERTY | VALUE/COMMENTS | |
| --- | --- | --- |
| | EXAMPLE 3A | EXAMPLE 3B |
| Flux Appearance | Viscous solution | Viscous solution with homogeneous distribution of resin particles |
| Flux Activity | | |
| Acid Value | 109.3 | 110.5 |
| Halide Value | 0.45 | 0.45 |
| Solder Paste Reflow | | |
| Nitrogen Atmosphere | Bright shiny solder surface | Bright shiny solder surface |
| Air Atmosphere | Complete non-coalescence. Poor wetting, extensive de-wetting or non-wetting | Complete coalescence. Good pad coverage, edges/ends of pads have some bare copper, fillet has good edge shape, no de-wetting or significant non-wetting. |

EXAMPLE 4

Formulations 4A and 4B were made in accordance with Table 8 which illustrate the effect of partially substituting a resin that is completely in solution by one that is not completely in solution. In this case, additional levels of activator have been used to illustrate that the resin out of solution adds to the effect produced by increasing activator level. Factors contributing directly to flux activity are held constant in examples 4A and 4B. The results are shown in Table 9. The proportions of the resin in solution/out of solution were approximately 100/0 for 4A, 55/45 for 4B.

TABLE 8

| RAW MATERIAL | WT % |
| --- | --- |
| A: CONVENTIONAL FORMULATION | |
| U.S. Gum rosin | 60 |
| Malonic acid | 0.53 |
| Salicylic acid | 1.0 |
| Trans-2,3-dibromo-2-butene-1,4-diol | 0.3 |
| 2-bromoethylamine hydrobromide | 0.4 |
| Meso-2,3-dibromosuccinic acid | 0.7 |
| Di-ethylene glycol di-butyl ether (Grant Chemical) | 12 |
| Tri-propylene glycol n-butyl ether (Dow) | 20 |
| Modified hydrogenated castor oil | 5 |
| B: EQUIVALENT FORMULATION BUT WITH RESINS NOT IN SOLUTION | |
| U.S. Gum rosin | 28.5 |
| Hydrogenated rosin (KE612, Arakawa) | 28.5 |
| Partially hydrogenated rosin (Staybelite Resin-E, Hercules B. V.) | 4.7 |
| Malonic acid | 0.6 |
| Salicylic acid | 1.0 |
| Trans-2,3-dibromo-2-butene- | 0.3 |

TABLE 8-continued

| RAW MATERIAL | WT % |
|---|---|
| 1,4-diol | |
| 2-bromoethylamine hydrobromide | 0.4 |
| Meso-2,3-dibromosuccinic acid | 0.7 |
| Di-ethylene glycol di-butyl ether (Grant Chemical) | 12.0 |
| Tri-propylene glycol n-butyl ether (Dow) | 19 |
| Modified hydrogenated castor oil (Univar plc) | 4.8 |

TABLE 9

| | VALUE/COMMENTS | |
|---|---|---|
| PROPERTY | EXAMPLE 4A | EXAMPLE 4B |
| Flux Appearance | Viscous solution | Viscous solution with homogeneous distribution of resin particles |
| Flux Activity | | |
| Acid Value | 109.8 | 113.3 |
| Halide Value | 0.45 | 0.45 |
| Solder Paste Reflow | | |
| Nitrogen Atmosphere | Bright shiny solder surface | Bright shiny solder surface |
| Air Atmosphere | Fillet surface covered with non-coalesced solder. Fair pad coverage. Some non-wetting or de-wetting, fillet edges may be uneven due to non-wetting of pad edges | Non coalescence at fillet ends only. Fair pad coverage. Some non-wetting or de-wetting, fillet edges may be uneven due to non-wetting of pad edges. |

What is claimed is:

1. A lead-free solder paste comprising a solder paste flux and a eutectic composition comprising solder alloy particles that are substantially lead-free wherein the solder paste flux comprises resin dissolved in a solvent and also includes undissolved resin particles less than 25 µm in size homogeneously dispersed therein to provide improved solder alloy powder coalescence and substrate surface wetting while maintaining appropriate solder paste rheology for use in printed circuit board assembly processes.

2. A lead-free solder paste as claimed in claim 1 wherein the solder paste flux resins are acidic.

3. A lead-free solder paste as claimed in claim 1 wherein the solder paste flux comprises from about 1 to about 60% by weight, based on the weight of the total flux, of dissolved resins and from about 1 to about 60% by weight, based on the weight of the total flux, of undissolved resins.

4. A lead-free solder paste as claimed in claim 1 wherein the solder paste flux dissolved resin is gum rosin or chemically modified rosin with an acid value in the range of 3 to 280.

5. A lead-free solder paste as claimed in claim 1 wherein the solder paste flux undissolved resin is gum rosin or chemically modified rosin with an acid value in the range 3 to 280.

6. A lead-free solder paste as claimed in claim 1 wherein the solder paste flux solvent is a high molecular weight alcohol, polyhydric alcohol, hydric ester or a mixture thereof.

7. A lead-free solder paste as claimed in claim 6 wherein the polyhydric alcohol is a glycol.

8. A lead-free solder paste as claimed in claim 7 wherein the glycol is diethylene glycol, dipropylene glycol or hexylene glycol.

9. A lead-free solder paste as claimed in claim 6 wherein the hydric ester is triethylene glycol monethyl ether or tetraethylene glycol dimethyl ether.

10. A lead-free solder paste as claimed in claim 1 wherein the solder paste flux further comprises an activator.

11. A lead-free solder paste as claimed in claim 10 wherein the activator is a weak carboxylic acids, alkyl cycloalkyl, aromatic amines, amine hydrohalide salts thereof or a combination thereof.

12. A lead-free solder paste as claimed in claim 11 wherein the activator is malonic acid, salicylic acid, adipic acid, succinic acid, diethylamine, triethylamine, cyclohexylamine, N-methylaniline or corresponding amine hydrohalides thereof.

13. A lead-free solder paste as claimed in claim 1 wherein the solder paste flux further comprises a gelling agent comprising ethylcellulose hydrogenated castor oil, fumed silica, organoclays or combinations thereof.

14. A lead-free solder paste as claimed in claim 1 comprising from about 70 to about 92% by weight of the solder alloy particles, from about 8 to about 30% by weight of the solder paste flux containing from about 50 to 80% resins, from about 20 to 50% solvents, from about 0.1 to 5% activators, and from about 0.1% to about 5% by weight of a gelling agent.

15. A method for the manufacture of a lead-free solder paste wherein the solder paste flux has two or more resins comprising the steps of dissolving the more soluble resin in part of the solvent and cooling the resultant solution to about 40 to 70° C., adding a dispersion of the less soluble resin made in the remainder of the solvent to the cooled solution and adding a gelling agent and allowing the mixture to cool and mixing with lead-free solder alloy particles.

16. A method for reducing the plasticisation of resin by solvents during reflow in a lead-free solder paste comprising a solder paste flux and a eutectic composition comprising substantially lead-free solder alloy particles, wherein the solder paste flux comprises resin and solvent which in addition to resin dissolved in the solvent also includes undissolved resin homogenously dispersed in the solvent.

17. A method for using a lead-free solder paste as claimed in claim 1 in lead-free soldering comprising:
applying the lead-free solder paste to a substrate; and
heating the lead-free solder paste to the eutectic melting temperature of the solder alloy particles.

18. A lead-free solder paste as claimed in claim 1, wherein the solder alloy particles are alloys of tin in combination with other metals selected from the group consisting of silver, copper, bismuth, antimony and combinations thereof.

19. A lead-free solder paste as claimed in claim 1, wherein the solder alloy particles are the combination of tin, silver and copper.

20. A lead-free solder paste as claimed in claim 19, wherein the solder alloy particles comprise about 3–4% silver and about 0.5 to 1.0% copper.

* * * * *